United States Patent
Azuma et al.

(10) Patent No.: US 11,411,130 B2
(45) Date of Patent: Aug. 9, 2022

(54) PHOTODETECTOR

(71) Applicant: DENSO CORPORATION, Kariya (JP)

(72) Inventors: Kenta Azuma, Kariya (JP); Noriyuki Ozaki, Kariya (JP); Shinji Kashiwada, Kariya (JP); Teiyu Kimura, Kariya (JP); Isamu Takai, Nagakute (JP); Hiroyuki Matsubara, Nagakute (JP); Mitsuhiko Ohta, Nagakute (JP); Shigeyoshi Hiratsuka, Nagakute (JP)

(73) Assignee: DENSO CORPORATION, Kariya (JP)

( * ) Notice: Subject to any disclaimer, the term of this patent is extended or adjusted under 35 U.S.C. 154(b) by 207 days.

(21) Appl. No.: 16/598,295

(22) Filed: Oct. 10, 2019

(65) Prior Publication Data

US 2020/0044109 A1 Feb. 6, 2020

Related U.S. Application Data

(63) Continuation of application No. PCT/JP2018/014938, filed on Apr. 9, 2018.

(30) Foreign Application Priority Data

Apr. 12, 2017 (JP) .............................. JP2017-079163

(51) Int. Cl.
| | |
|---|---|
| *H01L 31/107* | (2006.01) |
| *G01J 1/44* | (2006.01) |
| *H01L 27/144* | (2006.01) |
| *H01L 31/02* | (2006.01) |
| *G01T 1/24* | (2006.01) |
| *G01T 1/208* | (2006.01) |
| *G01T 1/20* | (2006.01) |

(52) U.S. Cl.
CPC ........ *H01L 31/107* (2013.01); *H01L 27/1443* (2013.01); *H01L 31/02027* (2013.01); *G01T 1/208* (2013.01); *G01T 1/20184* (2020.05); *G01T 1/24* (2013.01)

(58) Field of Classification Search
CPC .............. G01J 1/44; G01J 1/46; H01L 31/107
USPC ...................................... 250/370.01
See application file for complete search history.

(56) References Cited

U.S. PATENT DOCUMENTS

| | | | |
|---|---|---|---|
| 2011/0248175 A1 | 10/2011 | Frach et al. | |
| 2016/0259067 A1* | 9/2016 | Morton | ................... G01T 1/208 |
| 2017/0139041 A1* | 5/2017 | Drader | ................... G01S 7/4865 |
| 2017/0187721 A1* | 6/2017 | Raynor | ................... G01S 7/006 |
| 2017/0241832 A1* | 8/2017 | Schafer | ................ G01J 1/0271 |

FOREIGN PATENT DOCUMENTS

| | | |
|---|---|---|
| JP | 2012-060012 A | 3/2012 |
| JP | 2014-081254 A | 5/2014 |

* cited by examiner

*Primary Examiner* — David P Porta
*Assistant Examiner* — Fani Polyzos Boosalis
(74) *Attorney, Agent, or Firm* — Maschoff Brennan

(57) ABSTRACT

A photodetector includes: a photoreceptor provided with a SPAD that is configured to respond to incidence of a photon, and as the response of the SPAD, configured to output a pulse signal; and a pulse rate control circuit configured to control sensitivity of the photoreceptor to have a pulse rate as the number of pulse signals outputted per unit time from the photoreceptor to be a set value set in advance, (i) in a set range including the set value, (ii) in a set range of the set value or more, or (iii) in a set range of the set value or less.

17 Claims, 5 Drawing Sheets

PHOTODETECTOR

CROSS-REFERENCE TO RELATED APPLICATION

The present application is a continuation application of International Application No. PCT/JP2018/014938, filed Apr. 9, 2018, which claims priority to Japanese Patent Application No. 2017-079163, filed Apr. 12, 2017. The contents of these applications are incorporated herein by reference in their entirety.

BACKGROUND

1. Technical Field

The present disclosure relates to a photodetector using an avalanche effect.

2. Related Art

As a photodetector using an avalanche effect, a photodetector is known that operates an avalanche photodiode (hereinafter, an APD) in the Geiger mode for photodetection.

Such an APD operating in the Geiger mode is called as a SPAD and operates by application of a voltage higher than the breakdown voltage as a reverse bias voltage. SPAD is an abbreviation of a single photon avalanche diode.

SUMMARY

The present disclosure provides a photodetector. One mode of the present disclosure is a photodetector provided with a photoreceptor and a pulse rate control circuit.

A photoreceptor is provided with a SPAD that is configured to respond to incidence of a photon, and as the response of the SPAD, configured to output a pulse signal. A pulse rate control circuit is configured to control sensitivity of the photoreceptor to have a pulse rate as the number of pulse signals outputted per unit time from the photoreceptor to be a set value set in advance, (i) in a set range including the set value, (ii) in a set range of the set value or more, or (iii) in a set range of the set value or less.

DETAILED DESCRIPTION OF THE PREFERRED EMBODIMENTS

Figure 1:
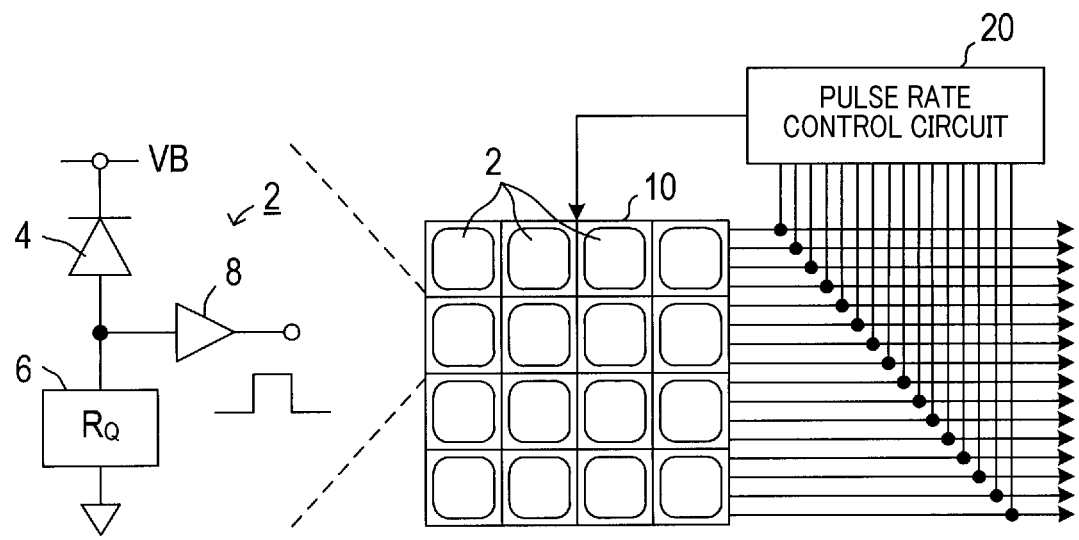
FIG. 1 is a diagram illustrating configuration of a photodetector in a first embodiment.

The inventor of the present disclosure has studied the following technique for a photodetector using an avalanche effect.

Such a SPAD undergoes breakdown due to incidence of photons, and thus a photodetector of this type is usually configured to detect a change in voltage when the SPAD undergoes breakdown and to output a digital pulse having a predetermined pulse width (hereinafter, a pulse signal).

The pulse signal has a pulse rate, as the number of outputs per unit time, varying in accordance with the amount of ambient light, and thus the pulse rate increases when very strong extraneous light or the like is incident on the photodetector. An increase in pulse rate causes a load on a downstream processing circuit, and in some cases, may saturate the processing circuit exceeding the capacity of the processing circuit.

Accordingly, when a photodetector of this type is mounted on a vehicle to be used for a range finder, ranging accuracy decreases with an increase in pulse rate, and in some cases, ranging may not be possible.

In such a photodetector of this type, the pulse rate thus has to be decreased by adjusting the sensitivity of a photoreceptor including a SPAD in an environment where the pulse rate increases, and the technique described in JP 2014-81254 A (hereinafter, PTL1) is proposed as a device to achieve that.

That is, the range finder described in PTL1 is configured to adjust the sensitivity of the photoreceptor by estimating the light quantity at the next measurement period in advance using a reference photoreception element and changing the reverse bias voltage and the like applied to the SPAD in accordance with the light quantity thus measured.

The proposed device adjusts the sensitivity of the photoreceptor in accordance with the light quantity thus measured, and when strong extraneous light is incident on the next measurement period, the device is capable of reducing the pulse rate of pulse signals outputted from the photoreceptor by decreasing the sensitivity of the photoreceptor.

However, after intensive investigation, the inventors found that the proposed device requires a complex device structure because the light quantity at the next measurement period has to be measured by providing the reference photoreception element for adjustment of the photoreceptor sensitivity.

For the sensitivity adjustment, a control value such as a reverse bias voltage has to be set in accordance with the light quantity measured using the reference photoreception element, and thus light quantity conversion data which convert the light quantity into the control value is required for control value setting. There is thus another problem that control section design takes too much time and effort because the light quantity conversion data has to be obtained in advance by actual measurement and the like to design a control section for sensitivity adjustment.

When the photoreceptor has variable properties, the control value obtained from the light quantity conversion data deviates from the optimal value. Accordingly, when the proposed device has the adjusted sensitivity of the photoreceptor, there is also a problem of not accommodating the variation in the properties of the photoreceptor.

While the proposed device is capable of decreasing the sensitivity of the photoreceptor when strong extraneous light is incident on the photoreceptor, the device is not capable of controlling the pulse rate to a desired value in accordance with the capacity of the downstream processing circuit. There is thus still another problem of not securely preventing a decrease in ranging accuracy due to an increase in load of the downstream processing circuit.

An aspect of the present disclosure is a photodetector to perform photodetection using a SPAD that is desirably capable of adjusting the sensitivity of the photoreceptor without using another detector for measurement of the light quantity and moreover properly performing the sensitivity adjustment in accordance with the capacity of a downstream processing circuit.

A photodetector in an aspect of the present disclosure includes: a photoreceptor provided with a SPAD that is configured to respond to incidence of a photon, and as the response of the SPAD, configured to output a pulse signal; and a pulse rate control circuit.

The pulse rate control circuit controls sensitivity of the photoreceptor to have a pulse rate as the number of pulse signals outputted per unit time from the photoreceptor to be a set value set in advance, (i) in a set range including the set value, (ii) the set value or more, or (iii) the set value or less.

Accordingly, even when the pulse rate of the pulse signals outputted from the photoreceptor changes due to ambient light, such as sunlight, the sensitivity of the photoreceptor is feedback controlled to have the pulse rate at a set value, (i) in a set range including the set value, (ii) in a set range of the set value or more, or (iii) in a set range of the set value or less.

The photodetector of the present disclosure is thus capable of operating the photoreceptor at a desired pulse rate and capable of suppressing problems, such as an increase in load of a downstream processing circuit due to an increase in pulse rate and failure of normal operation of the processing circuit due to input saturation of a downstream processing circuit.

The photodetector of the present disclosure is also capable of suppressing an abnormal rise in pulse rate of the pulse signals outputted by the photoreceptor and is thus capable of suppressing saturation of the photoreceptor itself due to incidence of strong light on the photoreceptor.

The photodetector of the present disclosure does not have to perform sensitivity adjustment of the photoreceptor by estimating a light quantity in advance and thus does not have to be provided with a reference photoreception element for measurement of the light quantity, allowing a simple device structure.

The sensitivity adjustment of the photoreceptor is performed based on the pulse rate of the pulse signals actually outputted from the photoreceptor, thereby allowing proper sensitivity adjustment of the photoreceptor without affected by variable properties of the photoreceptor.

Accordingly, variable properties of the photoreceptor do not cause excessive control or lack of control of the sensitivity of the photoreceptor. It is also possible to automatically accommodate variable properties of the photoreceptor, such as a SPAD, performance degradation, a change in properties with temperature change, and the like.

A photodetector in another aspect of the present disclosure includes: a plurality of photoreceptors; a threshold determination circuit configured to output a detection signal when the number of pulse signals outputted from the plurality of the photoreceptors reaches a threshold; and a pulse rate control circuit.

The pulse rate control circuit controls at least one of sensitivity of the plurality of the photoreceptors and the threshold of the threshold determination circuit to have a pulse rate as the number of the detection signals outputted per unit time from the threshold determination circuit to be a set value set in advance, (i) in a set range including the set value, (ii) in set range of the set value or more, or (iii) in a set range of the set value or less.

Accordingly, the photodetector is capable of controlling the pulse rate of the detection signals outputted from the threshold determination circuit to be a pulse rate allowing normal operation of a downstream processing circuit.

Similar to the photodetector described in the above aspect, the photodetector in this aspect is thus capable of suppressing problems such as an increase in load of a downstream processing circuit due to an increase in pulse rate and failure of normal operation of the processing circuit due to input saturation of a downstream processing circuit.

The reference signs in parentheses described in the appended claims show association with specific means in later-described embodiments and do not limit the technical scope of the present disclosure.

The above and other objectives, features and advantages of the present disclosure will be made more clear by the following detailed description, given referring to the appended drawings.

Embodiments of the present disclosure are described below with reference to the drawings.

First Embodiment

As illustrated in FIG. 1, a photodetector in the present embodiment includes a plurality of photoreceptors 2 provided with SPADs 4 to respond to incidence of photons. The plurality of photoreceptors 2 are arranged longitudinally and laterally in a grid to configure a photoreceptor array 10 configuring one pixel for photodetection.

In addition, as illustrated in FIG. 1, each photoreceptor 2 is provided with the SPAD 4, a quench resistor 6, and a pulse output unit 8.

The SPAD is, as described above, an APD operable in the Geiger mode, and the quench resistor 6 is serially connected to a conduction path to the SPAD 4.

The quench resistor 6 applies a reverse bias voltage VB to the SPAD 4 and also causes, when the SPAD 4 undergoes breakdown due to incidence of photons on the SPAD 4, a voltage drop due to the current flowing in the SPAD 4 to stop Geiger discharge of the SPAD 4.

The quench resistor 6 is configured with a resistive element having a predetermined resistance, a MOSFET capable of setting an on resistance at a gate voltage, or the like.

The pulse output unit 8 is connected to a connecting point between the SPAD 4 and the quench resistor 6. When the SPAD 4 undergoes breakdown, causing a current flowing in the quench resistor 6 and producing a voltage at a threshold voltage or more between both ends of the quench resistor 6, the pulse output unit 8 outputs a digital pulse to be a value 1 as the pulse signal described above.

From each photoreceptor 2 thus configured, a pulse signal is outputted at a frequency in accordance with an amount of ambient light. When strong light, such as sunlight, is incident on the photoreceptor 2, the number of pulse signals outputted per unit time from the photoreceptor 2, that is, a pulse rate, markedly increases.

When the pulse rate increases, a load in a downstream processing circuit increases, and in some cases, the downstream processing circuit may be saturated. For example, for use of the photoreceptor array 10 as a range finder mounted on a vehicle, there is a possibility of measurement operation not being performed normally.

The photodetector in the present embodiment includes a pulse rate control circuit 20 that incorporates a pulse signal outputted from each photoreceptor 2 configuring the photoreceptor array 10 and controls the sensitivity of each photoreceptor 2 to have the pulse rate at a desired pulse rate.

Figure 2:
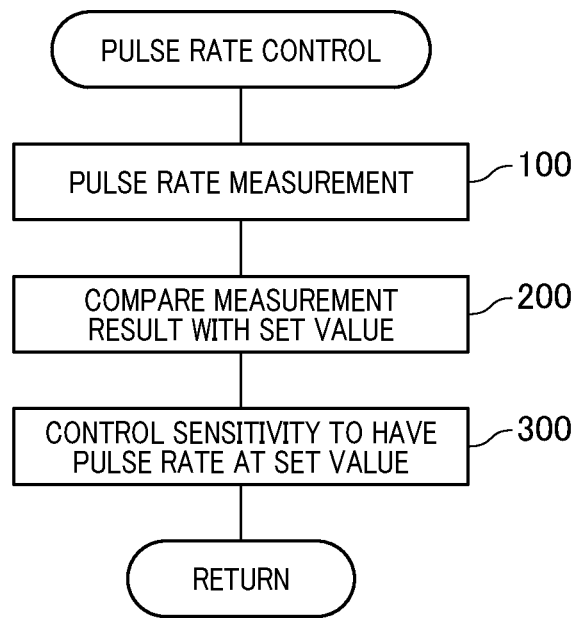
FIG. 2 is a flow chart illustrating operation of a pulse rate control circuit in the first embodiment.

The pulse rate control circuit 20 controls the sensitivity of the photoreceptors 2 in a procedure illustrated in FIG. 2. The pulse rate control circuit 20 is configured with a logic circuit.

In other words, the pulse rate control circuit 20 measures, at step S100, the pulse rate of the pulse signals outputted from each photoreceptor 2, and at subsequent step S200, compares the result of the measurement with a set value as a target value of the pulse rate. Then, at subsequent step S300, the pulse rate control circuit 20 controls the sensitivity of the photoreceptor 2 to have a difference between the pulse rate thus measured and the set value become zero or a predetermined value or less.

The pulse rate of the pulse signals outputted from each photoreceptor 2 may not be controlled to be the set value or in a predetermined range around the set value, or may be controlled to be (i) in a set range including the set value, (ii) in a set range of the set value or more, or (iii) in a set range of the set value or less.

That is, the pulse rate outputted from each photoreceptor 2 may be controlled, in accordance with the capacity of a downstream processing circuit, using the above set value to a pulse rate that allows proper processing of the downstream processing circuit.

It is possible to control the sensitivity of the photoreceptors 2 by, for example, changing the reverse bias voltage VB applied to the SPAD 4 between a breakdown voltage of the SPAD 4 and an upper limit voltage allowed by a withstand voltage of the SPAD 4. From the pulse rate control circuit 20 to the photoreceptor array 10, a respective control signal is thus outputted to adjust the reverse bias voltage VB of each photoreceptor 2.

In the photodetector in the present embodiment thus configured, the pulse rate of the pulse signals outputted from each photoreceptor 2 configuring the photoreceptor array 10 is controlled to be the set value or to be in the set range described above.

It is thus possible to suppress saturation of a downstream processing circuit due to an increase in load of the downstream processing circuit because of an increase in pulse rate of the pulse signals outputted from each photoreceptor 2. Accordingly, for use of the photoreceptor array 10 in a range finder, it is possible to normally perform the measurement operation even when strong light is incident on the photoreceptor array 10.

The photodetector in the present embodiment is also capable of suppressing an abnormal rise in pulse rate of the pulse signals outputted from each photoreceptor 2 and is thus capable of suppressing saturation of the photoreceptor 2 itself due to incidence of strong light on the photoreceptor 2.

The photodetector in the present embodiment does not have to perform sensitivity adjustment of the photoreceptors 2 by measuring a light quantity as described in PTL1 and thus does not have to be provided with a reference photoreception element for measurement of the light quantity, allowing a simple device structure.

In the present embodiment, the sensitivity adjustment of the photoreceptors 2 is performed based on the pulse rate of the pulse signals actually outputted from the photoreceptors 2 and thus proper sensitivity adjustment is possible without being affected by variable properties of the photoreceptors 2.

The sensitivity adjustment allows control of the pulse rate of the pulse signals outputted from the photoreceptors 2 at the set value or in the set range by accommodating influence of performance degradation of the photoreceptors 2 or a change in properties with temperature change.

Although, in the above description, the sensitivity adjustment is performed on all the photoreceptors 2 configuring the photoreceptor array 10, the sensitivity adjustment may be performed only on some photoreceptors 2 that are, for example, arranged in a region on which strong light tends to be incident.

Second Embodiment

In the first embodiment, the pulse rate control circuit 20 is described to measure the pulse rate for each photoreceptor 2 configuring the photoreceptor array 10 and adjust the sensitivity of the corresponding photoreceptors 2 to have the pulse rate at a set value or in a set range.

Figure 3:
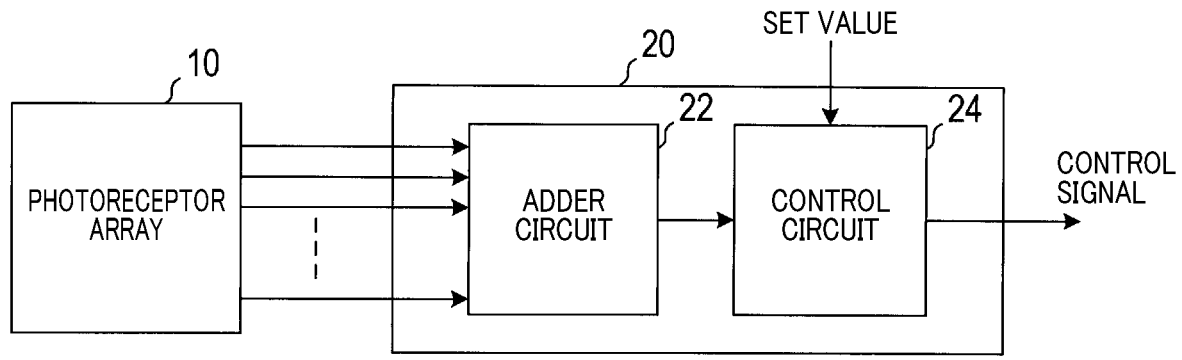
FIG. 3 is a block diagram illustrating internal configuration of a pulse rate control circuit in a second embodiment.

In contrast, in the present embodiment, as illustrated in FIG. 3, the pulse rate control circuit 20 is configured with an adder circuit 22 and a control circuit 24 to adjust the sensitivity of the entire photoreceptor array 10.

That is, the adder circuit 22 illustrated in FIG. 3 sums the number of pulse signals outputted from all the photoreceptors 2 of the photoreceptor array 10 within a predetermined measurement time to obtain an average value of the pulse rate of the pulse signals outputted from each photoreceptor 2 of the photoreceptor array 10.

The control circuit 24 then outputs a control signal to the photoreceptor array 10 to have the average value of the pulse rates obtained from the adder circuit 22 at the set value or in the set range, thereby adjusting the sensitivity of the photoreceptor array 10.

The pulse rate control circuit 20 thus configured allows sensitivity adjustment of the photoreceptor array 10 by measuring the pulse rate of the pulse signals outputted from the photoreceptor array 10 and does not have to perform sensitivity adjustment for each photoreceptor 2, thus achieving simple configuration.

The pulse rate control circuit 20 thus configured is also capable of controlling the average of the pulse rates of the pulse signals outputted from each photoreceptor 2 configuring the photoreceptor array 10 at a desired pulse rate. It is thus possible to suppress saturation of a downstream processing circuit due to an increase in load of the downstream processing circuit by a markedly increased pulse rate of the pulse signals inputted to the downstream processing circuit.

In the pulse rate control circuit 20 illustrated in FIG. 3, the control circuit 24 may compare the summed value with the set value using all bit data of the values summed in the adder circuit 22. The control circuit 24 may compare the summed value with the set value using significant bit data, such as the most significant bit, of the summed value.

Adjusting the sensitivity of the entire photoreceptor array 10, the pulse rate control circuit 20 may collectively adjust the reverse bias voltages VB applied to all the SPADs 4 configuring the respective photoreceptors 2 by the control signal outputted to the photoreceptor array 10. The sensitivity of the photoreceptor array 10 may be adjusted by adjusting a parameter different from the reverse bias voltages VB.

As illustrated in FIG. 3, the pulse rate control circuit 20 may be configured to allow the set value to be inputted by an external signal to the control circuit 24 inside. Such configuration allows arbitrary setting of the pulse rate of the pulse signals outputted from each photoreceptor 2 or the photoreceptor array 10 from outside.

Third Embodiment

Figure 4:
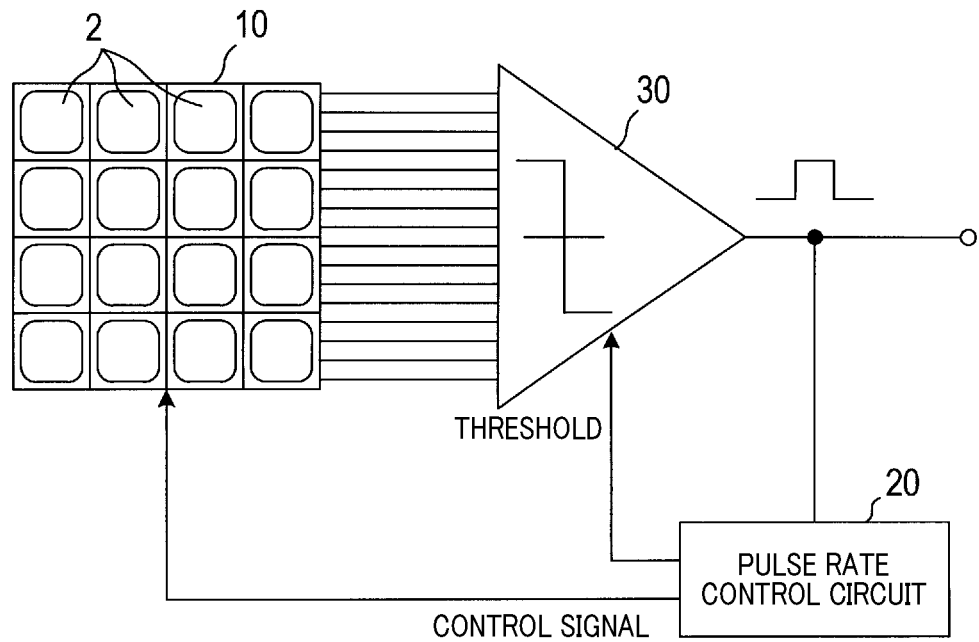
FIG. 4 is a diagram illustrating configuration of a photodetector in a third embodiment.

For use of the above photoreceptor array 10 in a range finder, the pulse signals from each photoreceptor 2 of the photoreceptor array 10 may be configured to, as illustrated in FIG. 4, be inputted to a threshold determination circuit 30.

Here, the threshold determination circuit 30 counts the number of pulse signals outputted from the plurality of photoreceptors 2 configuring the photoreceptor array 10 approximately simultaneously. When the count value is a threshold or more, the threshold determination circuit 30 determines that light at a predetermined level or more is incident on the photoreceptor array 10 to output a detection signal representing incidence of light.

As illustrated in FIG. 4, in the present embodiment, the detection signal outputted from the threshold determination circuit 30 is inputted to the pulse rate control circuit 20 and the pulse rate control circuit 20 measures the pulse rate based on the number of detection signals.

Figure 5:
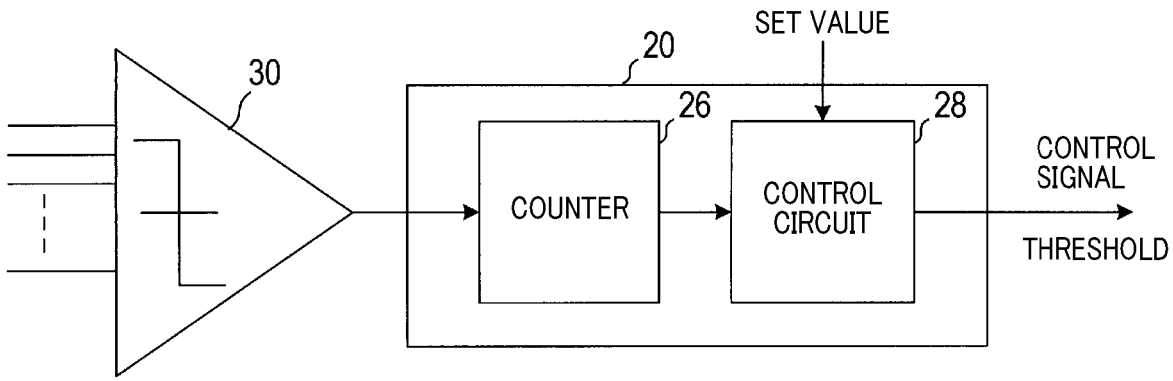
FIG. 5 is a block diagram illustrating internal configuration of a pulse rate control circuit in the third embodiment.

Specifically, as illustrated in FIG. 5, the pulse rate control circuit 20 in the present embodiment is provided with a counter 26 and a control circuit 28.

The counter 26 counts the number of detection signals outputted from the threshold determination circuit 30, and the control circuit 28 measures the count value counted by the counter 26 within a predetermined measurement time as the pulse rate of the detection signals outputted from the threshold determination circuit 30.

The control circuit 28 then adjusts the sensitivity of each photoreceptor 2 configuring the photoreceptor array 10 or the threshold of the threshold determination circuit 30 to have the pulse rate thus measured at a set value set in advance or by an external signal or in a set range corresponding to the set value.

The set range may be, similar to the above embodiments, (i) a predetermined range around the set value, may be (ii) a set range of the set value or more, or may be (iii) a set range of the set value or less.

That is, the pulse rate of the detection signals outputted from the threshold determination circuit 30 may be controlled by adjusting the sensitivity of each photoreceptor 2 configuring the photoreceptor array 10 or may be controlled by adjusting the threshold used by the threshold determination circuit 30 for determination.

In the present embodiment, the control circuit 28 controls the pulse rate of the detection signals outputted from the threshold determination circuit 30 by adjusting at least one of the sensitivities of each photoreceptor 2 configuring the photoreceptor array 10 and the threshold of the threshold determination circuit 30.

As a result, the present embodiment is capable of suppressing saturation of a downstream processing circuit due to an increase in load of the downstream processing circuit because of an increase in pulse rate of the detection signals outputted from the threshold determination circuit 30 to the downstream processing circuit. Accordingly, the photodetector in the present embodiment is also capable of obtaining the same effects as those in the first and second embodiments.

In the photodetector of the present embodiment, the pulse rate control circuit 20 may measure the pulse rate of the detection signals outputted from the threshold determination circuit 30 via a signal line of a single system, achieving simpler configuration of the pulse rate control circuit 20 compared with the first and second embodiments.

Fourth Embodiment

In the third embodiment, the pulse rate of the detection signals outputted from the threshold determination circuit 30 is controlled at the set value or in the set range to suppress saturation of a downstream processing circuit due to an increase in load of the downstream processing circuit.

However, an increase in load of the downstream processing circuit may be reduced by controlling the pulse rate of the detection signals inputted to the downstream processing circuit and not necessarily by controlling the pulse rate of the detection signals outputted from the one threshold determination circuit 30.

Figure 6:
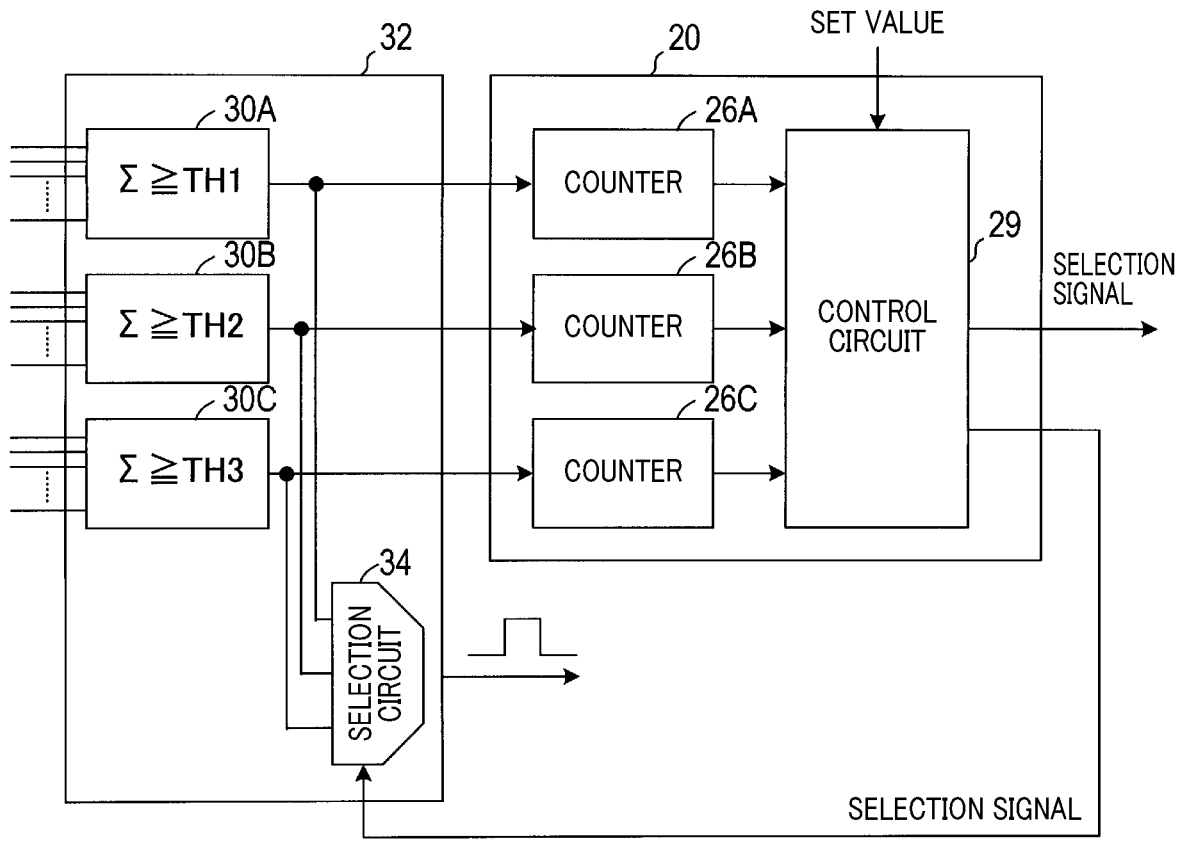
FIG. 6 is a block diagram illustrating configuration of a variable threshold determination circuit and a pulse rate control circuit in a fourth embodiment.

In the present embodiment, as illustrated in FIG. 6, a variable threshold determination circuit 32 is used provided with three threshold determination circuits 30A, 30B, and 30C having thresholds $\Sigma$ set at different values TH1, TH2, and TH3.

A detection signal outputted from any one of the three threshold determination circuits 30A, 30B, and 30C is selected using a selection circuit 34 provided in the variable threshold determination circuit 32 and outputted to the downstream processing circuit.

In the present embodiment, the pulse rate control circuit 20 is provided with three counters 26A, 26B, and 26C to count the respective detection signals outputted from the three threshold determination circuits 30A, 30B, and 30C of the variable threshold determination circuit 32.

A control circuit 29 provided in the pulse rate control circuit 20 then measures the count values counted by the respective counters 26A, 26B, and 26C within a predetermined measurement time as pulse rates of the detection signals outputted from the respective threshold determination circuits 30A, 30B, and 30C.

Using the pulse rates thus measured, the control circuit 29 specifies the threshold determination circuit outputting the detection signal at a pulse rate closest to the set value from the three threshold determination circuits 30A, 30B, and 30C. The control circuit 29 then switches the selection circuit 34 to output the detection signal from the threshold determination circuit thus specified to the downstream processing circuit.

The control circuit 29 outputs a control signal to the photoreceptor array 10 to have the pulse rate of the detection signals outputted from the threshold determination circuit selected by the selection circuit 34 at the set value or in the set range.

Accordingly, even when the photodetector in the third embodiment illustrated in FIG. 4 is provided with the variable threshold determination circuit 32 and the pulse rate control circuit 20 in the present embodiment, it is possible to obtain the same effects as those in the third embodiment.

When the pulse rate of the detection signals outputted from the threshold determination circuit selected by the selection circuit 34 greatly deviates from the set value, the pulse rate of the detection signals outputted to the downstream processing circuit is brought closer to the set value by switching the threshold determination circuit to be selected by the selection circuit 34.

Since the control circuit 29 is capable of obtaining the pulse rate of the detection signals outputted from the plurality of threshold determination circuits 30A, 30B, and 30C configuring the variable threshold determination circuit 32, the pulse rate after switching the threshold determination circuit to be selected by the selection circuit 34 is allowed to be recognized in advance.

The pulse rate of the detection signals to be outputted to the downstream processing circuit is thus allowed to be controlled at the set value or in the set range in a short time, thus allowing improvement in control accuracy.

The number of threshold determination circuits provided in the variable threshold determination circuit 32 may be plural, and may be two, four, or more.

Although embodiments to carry out the present disclosure are described above, the present disclosure is not limited to the embodiments above and may be carried out by being modified variously.

First Modification

In each photodetector in the second through fourth embodiments, the sensitivity adjustment of a pixel configured with the photoreceptor array 10 is described to be performed by changing the reverse bias voltage applied to the SPADs 4 or another parameter of the photoreceptors 2.

Figure 7:
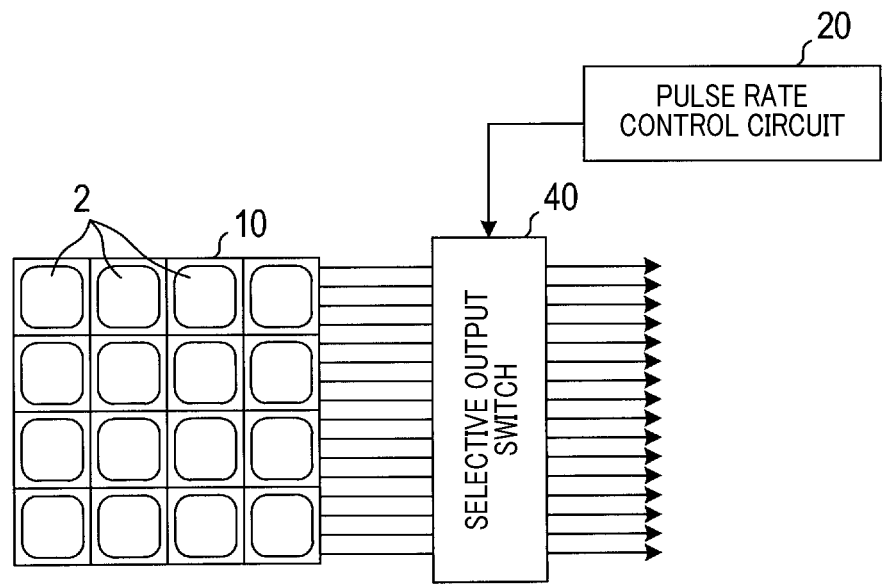
FIG. 7 is a diagram illustrating a selective output switch in a first modification.

In contrast, as illustrated in FIG. 7, in a signal path to output a pulse signal from each photoreceptor 2 of the photoreceptor array 10 to the threshold determination circuit 30, a selective output switch 40 to conduct or block the signal path for each photoreceptor 2 may be provided.

This allows the pulse rate control circuit 20 to control the pulse rate by increasing or decreasing the number of pulse signals outputted from the photoreceptor array 10 or the number of pulse signals inputted to the threshold determination circuit 30 using the selective output switch 40.

The signal path blocked by the pulse rate control circuit 20 using the selective output switch 40 may be set in advance or an arbitrary path may be blocked.

Second Modification

In each embodiment above, the sensitivity of the photoreceptor array 10 or each photoreceptor 2 or the threshold of the threshold determination circuit 30 that is controlled by the pulse rate control circuit 20 changes depending on the environment in use, such as the amount of ambient light, and also changes depending on degradation in properties of the photoreceptor array 10 or a peripheral circuit.

Figure 8:
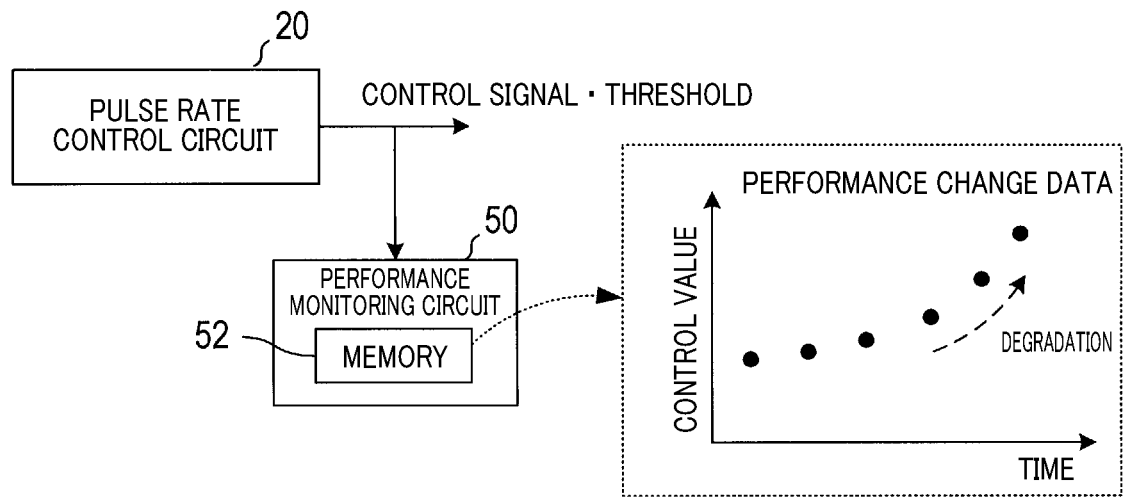
FIG. 8 is a diagram illustrating configuration of a performance monitoring circuit in a second modification.

As illustrated in FIG. 8, a performance monitoring circuit 50 may thus be provided to monitor a control value, such as the control signal outputted from the pulse rate control circuit 20 and the threshold, and periodically store it a memory 52.

This allows a user to obtain a state of degradation in the performance of the photodetector from a time series change in control value stored in the memory 52, leading to effective use of the performance monitoring circuit 50 for maintenance and management of the photodetector and a range finder and the like using the photodetector.

Third Modification

In each embodiment above, the pulse rate control circuit 20 adjusts the sensitivity of the photoreceptor array 10 or each photoreceptor 2 configuring the photoreceptor array 10 or the threshold determination circuit 30 to have the measured pulse rate at the set value or in the set range.

If the pulse rate control is not capable of controlling the pulse rate, the photodetector itself is determined to be abnormal.

Figure 9:
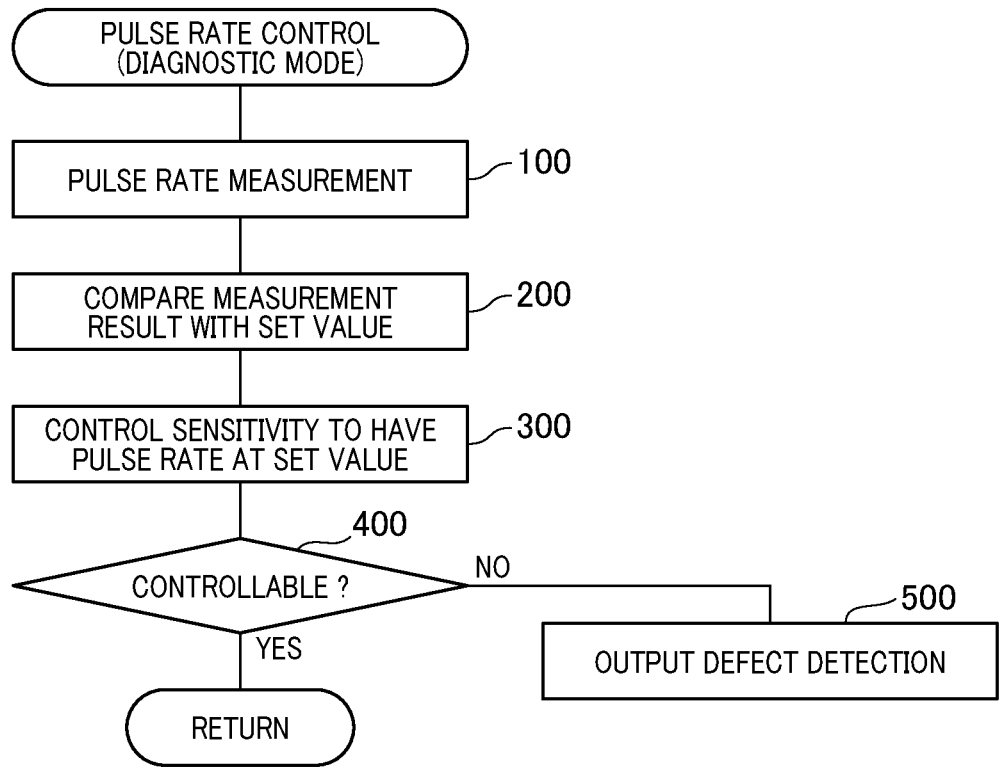
FIG. 9 is a flow chart illustrating operation of a pulse rate control circuit in a third modification.

The pulse rate control circuit 20 may operate in the procedure illustrated in FIG. 9 during operation in a diagnostic mode, such as on startup.

That is, in the diagnostic mode, similar to the pulse rate control illustrated in FIG. 2, the sensitivity is adjusted to have the pulse rate at the set value or in the set range in the process of step S100 through step S300, and then the process continues to step S400. At step S400, whether the pulse rate changes is determined or at least whether a pulse is outputted is detected to determine whether the pulse rate is controllable.

If the pulse rate is determined as uncontrollable at step S400, the photodetector is not operating normally and the process proceeds to step S500 to notify a user and an external device that the photodetector is in an abnormal state.

This allows the defect detection of the photodetector to be performed from the result of controlling the pulse rate, and when a defect is found, it is possible to prohibit an external device, such as a range finder, from performing control using the photodetector. It also allows a user to be notified of the defect of the photodetector and thus to immediately take measures, such as repairs.

Fourth Modification

Figure 10:
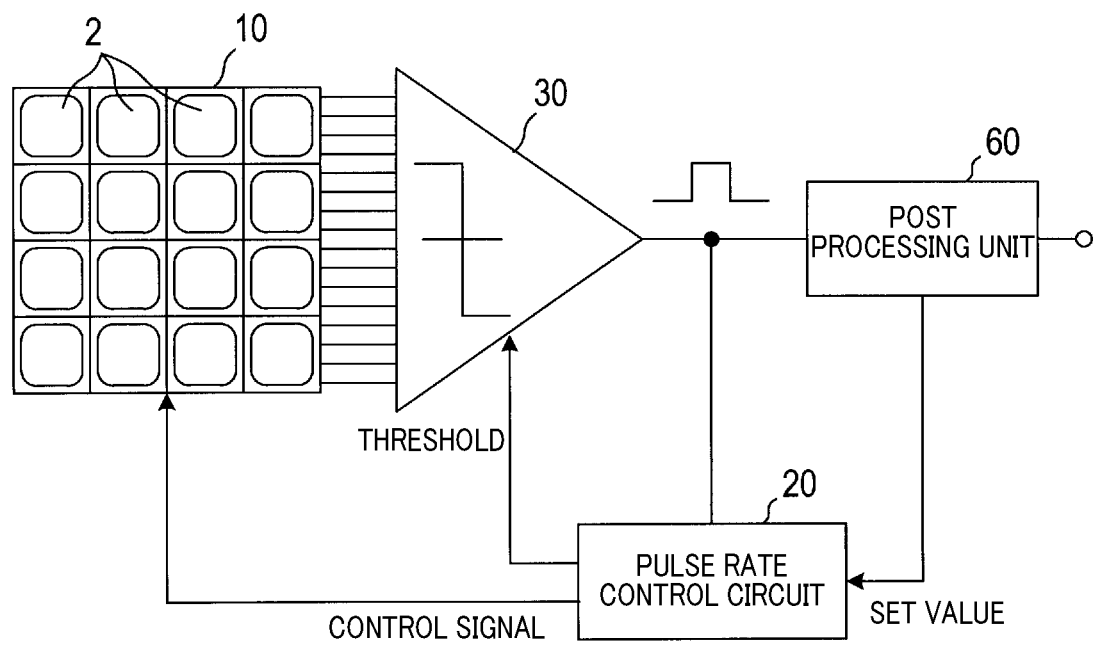
FIG. 10 is a diagram illustrating configuration of a photodetector in a fourth modification.

When the pulse rate control circuit 20 is configured to allow input of a set value from outside to the control circuits 24, 28, and 29 as described above, the set value may be inputted from, as exemplified in FIG. 10, a post processing unit 60 including a processing circuit to process the detection signal from the threshold determination circuit 30.

That is, examples of the post processing unit 60 may include a time measurement unit to measure the time from emission of light for ranging by a range finder to reception of the reflected light by a photodetector and the like. It should be noted that, in the post processing unit 60, the required pulse rate sometimes changes due to an external factor.

For example, the post processing unit 60 sometimes has to reduce the processing load to reduce heat generation by itself during a rise in environmental temperature or sometimes has to reduce the processing load due to a factor different from the signal processing from the photodetector.

In such a case, if the post processing unit 60 is allowed to assign the set value to the pulse rate control circuit 20, it is possible to temporarily decrease the pulse rate of the detection signals outputted from the photodetector to the post processing unit 60 to reduce the processing load for the signal processing.

In the fourth modification, the set value of the pulse rate controlled by the pulse rate control circuit 20 is changed by a command from the post processing unit 60 to allow the detection signal to be outputted at a pulse rate required by the post processing unit 60. This allows improvement in usability of the photodetector and an increase in applications thereof.

A plurality of functions of one component in the above embodiments may be achieved by a plurality of components, or one function of one component may be achieved by a plurality of components. A plurality of functions of a plurality of components may be achieved by one component, or one function achieved by a plurality of components may be achieved by one component. Some of the configuration in the above embodiments may be omitted. At least part of the configuration in the above embodiments may be added to or substituted for the configuration in another of the above embodiments. Embodiments of the present disclosure include all embodiments contained in the technical spirit specified only by the description in the appended claims.

What is claimed is:

1. A photodetector comprising:
a plurality of photoreceptors, in which each photoreceptor is provided with a single photon avalanche diode (SPAD) that is configured to respond to incidence of a photon, and as the response of the SPAD, configured to output a pulse signal;
a pulse rate control circuit configured to control sensitivity of the plurality of the photoreceptors to have an average of pulse rates as the number of pulse signals outputted per unit time from the plurality of the photoreceptors to be a set value set in advance, in a set range including (i) the set value, (ii) the set value or more, or (iii) the set value or less; and
a selective output switch configured to select one or more photoreceptors to output a pulse signal from the plurality of the photoreceptors, wherein
the pulse rate control circuit is configured to control the sensitivity of the plurality of the photoreceptors by controlling the pulse rates to increase or decrease the number of the pulse signals outputted from the plurality of the photoreceptors using the selective output switch.

2. The photodetector according to claim 1, wherein the pulse rate control circuit is configured to measure the pulse rate by counting outputs of the pulse signal from the photoreceptor.

3. The photodetector according to claim 1, wherein
the pulse rate control circuit is configured to control sensitivity of the plurality of the photoreceptors to have an average of the pulse rates of the pulse signals outputted from the plurality of the photoreceptors to be the set value, (i) in the set range, (ii) the set value or more, or (iii) the set value or less.

4. The photodetector according to claim 3, wherein
the pulse rate control circuit is configured to control the sensitivity of the plurality of the photoreceptors by changing the number of the photoreceptors to output the pulse signal using the selective output switch.

5. The photodetector according to claim 1, wherein the pulse rate control circuit is configured to allow setting of the set value by an external signal.

6. The photodetector according to claim 1, comprising a performance monitoring circuit configured to store a control value set for control of the pulse rate in the pulse rate control circuit as data representing performance of the photodetector.

7. The photodetector according to claim 1, wherein the pulse rate control circuit is configured to perform defect detection of the photodetector based on a result of controlling the pulse rate.

8. The photodetector according to claim 1, wherein the pulse rate control circuit is configured to control the sensitivity of the photoreceptor by changing a reverse bias voltage applied to the SPAD.

9. The photodetector according to claim 1, wherein the pulse rate control circuit is configured to control the sensitivity of the photoreceptor that light at a predetermined level or more is incident thereon, among the plurality of the photoreceptors.

10. A photodetector comprising:
a plurality of photoreceptors, each provided with a SPAD that is configured to respond to incidence of a photon, and as the response of the SPAD, configured to output a pulse signal;
a threshold determination circuit configured to output a detection signal when the number of pulse signals outputted from the plurality of the photoreceptors reaches a threshold; and
a pulse rate control circuit configured to control at least one of sensitivity of the plurality of the photoreceptors and the threshold of the threshold determination circuit to have a pulse rate as the number of the detection signals outputted per unit time from the threshold determination circuit to be a set value set in advance, (i) in a set range including the set value, (ii) the set value or more, or (iii) the set value or less.

11. The photodetector according to claim 10, comprising a variable threshold determination circuit provided with a plurality of the threshold determination circuits, each having the threshold set at a different value, and configured to output one selected from the detection signals outputted from the plurality of threshold determination circuits, wherein
the pulse rate control circuit is configured to measure the pulse rate by counting the respective detection signals outputted from the plurality of the threshold determination circuits provided in the variable threshold determination circuit and to set the threshold determination circuit selected by the variable threshold determination circuit based on a result of the measurement.

12. The photodetector according to claim 10, wherein the pulse rate control circuit is configured to control the sensitivity of the photoreceptor by changing a reverse bias voltage applied to the SPAD.

13. The photodetector according to claim 10, comprising a selective output switch configured to select a photoreceptor to output a pulse signal from the plurality of the photoreceptors, wherein
the pulse rate control circuit is configured to control the sensitivity of the photoreceptors by changing the number of the photoreceptors to output the pulse signal to the threshold determination circuit using the selective output switch.

14. The photodetector according to claim 10, wherein the pulse rate control circuit is configured to allow setting of the set value by an external signal.

15. The photodetector according to claim 10, comprising a performance monitoring circuit configured to store a control value set for control of the pulse rate in the pulse rate control circuit as data representing performance of the photodetector.

16. The photodetector according to claim 10, wherein the pulse rate control circuit is configured to perform defect detection of the photodetector based on a result of controlling the pulse rate.

17. The photodetector according to claim 10, wherein, the threshold determination circuit is configured to:
count the number of the pulse signals outputted from the plurality of the photoreceptors;
determine that light at a predetermined level or more is incident on the plurality of the photoreceptors in response to determining that a count value is a predetermined threshold or more; and
output the detection signal representing incidence of light.

* * * * *